US010008662B2

(12) United States Patent
You et al.

(10) Patent No.: US 10,008,662 B2
(45) Date of Patent: Jun. 26, 2018

(54) PERPENDICULAR MAGNETIC TUNNELING JUNCTION (MTJ) FOR IMPROVED MAGNETORESISTIVE RANDOM-ACCESS MEMORY (MRAM) PROCESS

(71) Applicant: Taiwan Semiconductor Manufacturing Co., Ltd., Hsin-Chu (TW)

(72) Inventors: Wen-Chun You, Dongshan Township (TW); Kuo-Chi Tu, Hsin-Chu (TW); Chih-Yang Chang, Yuanlin Township (TW); Hsia-Wei Chen, Taipei (TW); Chin-Chieh Yang, New Taipei (TW); Sheng-Hung Shih, Hsinchu (TW); Wen-Ting Chu, Kaohsiung (TW); Yu-Wen Liao, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 14/645,683

(22) Filed: Mar. 12, 2015

(65) Prior Publication Data
US 2016/0268499 A1 Sep. 15, 2016

(51) Int. Cl.
*H01L 21/336* (2006.01)
*H01L 43/08* (2006.01)
(Continued)

(52) U.S. Cl.
CPC .............. *H01L 43/08* (2013.01); *H01L 43/12* (2013.01); *H01L 27/228* (2013.01)

(58) Field of Classification Search
CPC ......... H01L 43/08; H01L 43/12; H01L 43/10; H01L 43/02; G11C 11/161
(Continued)

(56) References Cited

U.S. PATENT DOCUMENTS 6,897,532 B1  5/2005  Schwarz et al.
7,416,945 B1  8/2008  Muralidhar et al.
(Continued)

FOREIGN PATENT DOCUMENTS

CN  201741934 A  10/2012
CN  201881821 A  1/2013

OTHER PUBLICATIONS

Notice of Allowance dated Sep. 23, 2015 U.S. Appl. No. 14/023,552.
(Continued)

*Primary Examiner* — Anthony Ho
*Assistant Examiner* — Mohammad M Hoque
(74) *Attorney, Agent, or Firm* — Eschweiler & Potashnik, LLC

(57) ABSTRACT

A method of forming a magnetoresistive random access memory (MRAM) device including a perpendicular MTJ (magnetic tunnel junction) is provided. The method includes forming a magnetic tunneling junction (MTJ) over a bottom electrode layer. A top electrode layer is formed over an upper surface of the MTJ, and a hard mask is formed over an upper surface of the top electrode layer. A first etch is performed through the top electrode layer, through regions of the MTJ unmasked by the hard mask, to form a top electrode and an etched MTJ. Sidewall spacers are formed extending from an upper surface of the hard mask or the top electrode, along sidewalls of the top electrode and the etched MTJ, to a point below or about even with an upper surface of the bottom electrode. A resulting MRAM device structure is also provided.

18 Claims, 10 Drawing Sheets

(51) Int. Cl.
*H01L 43/12* (2006.01)
*H01L 27/22* (2006.01)

(58) Field of Classification Search
USPC .......................................................... 438/198
See application file for complete search history.

(56) References Cited

U.S. PATENT DOCUMENTS

| | | |
|---|---|---|
| 7,932,189 B2 | 8/2011 | Merchant et al. |
| 8,546,871 B2 | 10/2013 | Huang et al. |
| 8,747,680 B1 | 6/2014 | Deshpande et al. |
| 8,923,044 B2 | 12/2014 | Li et al. |
| 2004/0205958 A1* | 10/2004 | Grynkewich ........... G11C 11/16 29/603.14 |
| 2009/0130779 A1* | 5/2009 | Li ............................ H01L 43/12 438/3 |
| 2009/0209050 A1* | 8/2009 | Wang ..................... H01L 27/228 438/3 |
| 2010/0053823 A1 | 3/2010 | Iwayama |
| 2010/0102406 A1 | 4/2010 | Xi et al. |
| 2010/0117169 A1 | 5/2010 | Anderson et al. |
| 2011/0008956 A1 | 1/2011 | Lee et al. |
| 2011/0049656 A1* | 3/2011 | Li ............................ G11C 11/16 257/421 |
| 2011/0076784 A1* | 3/2011 | Druist ................... H01L 27/228 438/3 |
| 2011/0104827 A1 | 5/2011 | Gaidis |
| 2011/0235217 A1 | 9/2011 | Chen et al. |
| 2012/0139069 A1 | 6/2012 | Kim |
| 2012/0205764 A1* | 8/2012 | Chen ....................... G11C 11/16 257/422 |
| 2012/0217476 A1* | 8/2012 | Ikeno .................... G11C 11/161 257/16 |
| 2012/0230089 A1 | 9/2012 | Yamada et al. |
| 2013/0029431 A1* | 1/2013 | Takahashi ............... H01L 43/12 438/3 |
| 2013/0034917 A1* | 2/2013 | Lee ......................... H01L 43/12 438/3 |
| 2013/0062714 A1* | 3/2013 | Zhu ......................... G11C 11/16 257/421 |
| 2013/0069182 A1* | 3/2013 | Ohsawa .................. H01L 29/82 257/421 |
| 2013/0337582 A1* | 12/2013 | Satoh ...................... H01L 43/12 438/3 |
| 2014/0070162 A1 | 3/2014 | Iwayama |
| 2015/0021725 A1 | 1/2015 | Hsu et al. |
| 2015/0102006 A1 | 4/2015 | Mudivarthi et al. |
| 2015/0171314 A1 | 6/2015 | Li et al. |
| 2015/0255507 A1* | 9/2015 | Pakala .................... H01L 43/12 257/421 |
| 2015/0287910 A1 | 10/2015 | Lu et al. |
| 2015/0287912 A1* | 10/2015 | Park ........................ H01L 43/12 257/421 |

OTHER PUBLICATIONS

Sungwook Jung, et al.; "Fabrication of Needle-Like Nanostructures Using Block Copolymer for Non-Volatile Memory"; Materials Science and Engineering; www.elsevier.com/locate/msec; C27, 2007, p. 1452-1455.
Hiratsuka, et al. "Fabrication of perpendicularly magnetized magnetic tunnel junctions with L10-CoPt/Co2MnSi hybrid electrode." Journal of Applied Physics 107, 09C714 (2010). May 6, 2010.
Endoh "Emerging Research Memory Technologies Spin Transfer Torque MRAM (SPRAM) and its Applications." Feb. 28, 2010.
Natarajarathinam. "Exploration of Perpendicular Magnetic Anisotropy Material System for Application in Spin Transfer Torque—Random Access Memory (STT-RAM)." Tuscaloosa, Alabama, 2012.
U.S. Appl. No. 14/023,552, filed Sep. 11, 2013.
U.S. Appl. No. 14/608,313, filed Jan. 29, 2015.
Non Final Office Action dated May 26, 2015 U.S. Appl. No. 14/023,552.
Final Office Action dated Jun. 3, 2016 U.S. Appl. No. 14/608,313.
Y. J. Lee, et al., "Demonstration of Chip Level Writability, Endurance and Data Retention of an Entire 8MB STT-MRAM Array," 2013 International Symposium on VLSI Technology, Systems, and Applications (VLSI-TSA), p. 1-2, Apr. 22-24, 2013.
Notice of Allowance dated Sep. 16, 2016 U.S. Appl. No. 14/608,313.
Non Final Office Actiondated Jan. 13, 2017 U.S. Appl. No. 14/990,911.
Final Office Action dated Oct. 10, 2017 U.S. Appl. No. 14/990,911.
Non Final Office Action dated Feb. 25, 2016 U.S. Appl. No. 14/608,313.

* cited by examiner

PERPENDICULAR MAGNETIC TUNNELING JUNCTION (MTJ) FOR IMPROVED MAGNETORESISTIVE RANDOM-ACCESS MEMORY (MRAM) PROCESS

BACKGROUND

Many modern day electronic devices contain electronic memory. Electronic memory may be volatile memory or non-volatile memory. Non-volatile memory is able to store data in the absence of power, whereas volatile memory is not. Magnetoresistive random-access memory (MRAM) is one promising candidate for next generation electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 through 14A-14B illustrate a series of incremental manufacturing steps as a series of cross-sectional views, according to the method of FIG. 3.

DETAILED DESCRIPTION

Figure 1A:
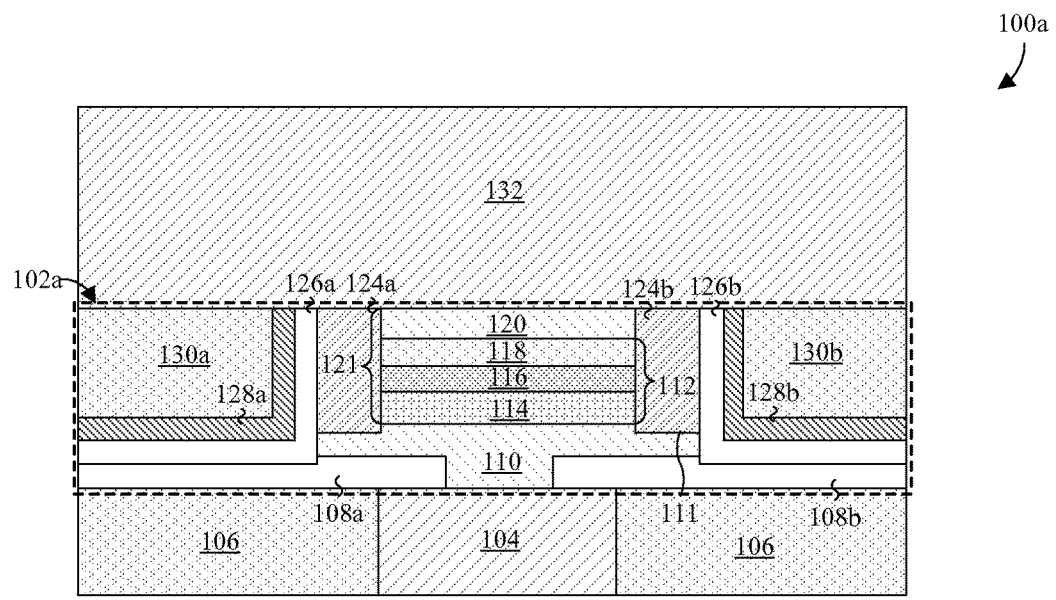
FIG. 1A illustrates a cross-sectional view of some embodiments of an MRAM cell, including a perpendicular magnetic tunneling junction (MTJ), according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "second", etc. may be used herein for ease of description to distinguish between different elements of a figure or a series of figures. "first", "second", "second", etc. are not intended to be descriptive of the corresponding element. Therefore, "a first dielectric layer" described in connection with a first figure may not necessarily corresponding to a "first dielectric layer" described in connection with another figure.

A magnetoresistive random-access memory (MRAM) cell includes a upper and lower electrodes and a magnetic tunneling junction (MTJ) arranged between the upper and lower electrodes. The MTJ includes a upper and lower ferromagnetic layers, which manifest as a free ferromagnetic layer and a pinned ferromagnetic layer, and a barrier layer arranged between the upper and lower ferromagnetic layers. The pinned layer has a permanent or fixed magnetic polarity, typically pinned by an anti-ferromagnetic layer arranged between one of the electrode layers and the pinned layer. The free layer can be switched between two or more distinct magnetic polarities that each represents a unit of data, such as a bit of data.

In some MRAM cells, magnetic polarities of the free layer and pinned layer are in the same horizontal plane as one another such that they are either parallel or anti-parallel (depending on the value of the data bit) with regard to the horizontal plane—this is known as an "in-plane" MTJ structure. In a traditional in-plane MTJ structure, an after-etch-inspection critical dimension (AEICD) is small. Hence, in an in-plane MTJ cell, there is limited space over the upper electrode to land a top electrode via (TEVA) on the upper electrode. Therefore, in order to providing sufficient space to land a TEVA, the upper electrode includes an upper portion with a larger area and a base portion with a smaller area on which the upper portion rests. A shortcoming such an MRAM cell is that the upper electrode is fairly thick to incorporate the base and upper portions, and this thickness results in the MRAM cell having a large step-height. Because of this large step height, the MRAM cell requires a relatively thick dielectric layer (which is usually an extremely low-k dielectric (ELK) layer) to cover the MTJ structure. After being initially deposited, low-k dielectric materials typically require a curing process in order to increase their porosities, lower their k values, and improve their mechanical strengths. A thicker ELK layer will induce poor curing. Further, a chemical mechanical polishing (CMP) process is also required to planarize the ELK layer when it is thicker. However, poor curing and a thick ELK layer will result in poor CMP uniformity, which can lead to a number of problems in the manufacturing process.

In view of the foregoing, the present application is directed to a structure and method for manufacturing an MRAM cell that includes a perpendicular MTJ (p-MTJ) structure. P-MTJs have a larger AEICD than in-plane MTJs and hence there is enough space for landing a TEVA. In a perpendicular MTJ structure, magnetic polarities of the free layer and the pinned layer are oriented perpendicular to the horizontal plane in which they are formed. Accordingly, the free layer and the pinned layer in perpendicular MTJ structures are either parallel or anti-parallel (depending on the stored binary value), with regard to a vertical/perpendicular plane. P-MTJs are also advantageous due to low switching current and faster switching speed.

Advantageously, by forming an MRAM cell with a p-MTJ, there is enough space for landing the TEVA over the MRAM cell, and hence processing steps associated with forming an upper electrode with a narrower base and wider top portion may be avoided. Further, the need for the thicker ELK layer and hence the ELK layer CMP process are also eliminated. This helps in reducing the overall cost of manufacturing the MRAM cell. Moreover, the thinner ELK and the smaller top electrode also help in having a reduced step-height for the MRAM cell. Such a processing method is also highly compatible with a logic backend process.

With reference to FIG. 1A, a cross-sectional view 100a of some embodiments of a MRAM cell 102a, having a perpendicular MTJ is provided. The MRAM cell 102a resides over a bottom electrode via (BEVA) 104 disposed within a dielectric layer 106, which for example acts as an etch-stop layer. In some embodiments, the dielectric layer 106 comprises an extremely low-k (ELK) dielectric layer. Dielectric protection layers 108a and 108b which are laterally spaced, are disposed over an upper surface of a semiconductor substrate 2. A bottom electrode 110 of the MRAM cell 102a is arranged over the dielectric protection layers 108a and 108b, and is electrically coupled to a first metallization layer (not shown) of a BEOL metallization stack through the BEVA 104. The bottom electrode 110 may be a conductive material, such as, for example, titanium nitride, tantalum nitride, titanium, tantalum, or a combination of two or more of the foregoing. Further, the bottom electrode 110 may be, for example, about 10-100 nanometers thick. The BEVA 104 may be, for example, a metal, such as copper, gold, aluminum, tungsten or combinations thereof. In some embodiments, the dielectric protection layers 108a and 108b comprise silicon carbide (SiC).

A MTJ 112 is stacked over the bottom electrode 110. The MTJ 112 has a smaller footprint than the bottom electrode 110. Due to the difference in footprints, the MTJ 112 and the bottom electrode 110 collectively define a ledge 111. The MTJ 112 comprises a first ferromagnetic layer 114, an insulating barrier layer 116 disposed above the first ferromagnetic layer 114, and a second ferromagnetic layer 118 disposed over the insulating barrier layer 116. In some embodiments, the first ferromagnetic layer 114 is a free layer having variable magnetic polarities representing a unit of data. For example, the variable magnetic polarity switches between a first state and a second state that respectively represent a binary "0" and a binary "1". In some embodiments, the second ferromagnetic layer 118 is a pinned layer having fixed magnetic polarity. In some embodiments an anti-ferromagnetic layer (not shown) is arranged under and typically abutting a lower surface of the pinned layer (118) and an upper surface of the insulating barrier layer 116. The anti-ferromagnetic layer pins the pinned layer to a permanent or fixed magnetic polarity. In some embodiments, the first ferromagnetic layer 114 comprises FePt (iron-platinum) or CoFeB (alloy of cobalt, iron and boron) having a thickness ranging between approximately 8 angstroms and approximately 13 angstroms, and the second ferromagnetic layer comprises single or multiple layers of Co (cobalt), Ni (nickel), Ru (ruthenium). The insulating barrier layer 116 provides electrical isolation between the first ferromagnetic layer 114 and the second ferromagnetic layer 118, while still allowing electrons to tunnel through the insulating barrier layer 116 under proper conditions. The insulating barrier layer 116 may be, for example, magnesium oxide or aluminum oxide (e.g., $Al_2O_3$). Further, the insulating barrier layer 116 may be, for example, about 0.5-2 nanometers thick.

In operation, the variable magnetic polarity of the first ferromagnetic layer 114 is typically read by measuring the resistance of the MTJ 112. Due to the magnetic tunnel effect, the resistance of the MTJ 112 changes with the variable magnetic polarity. Further, in operation, the variable magnetic polarity is typically changed or toggled using the spin-transfer torque (STT) effect. According to the STT effect, current is passed across the MTJ 112 to induce a flow of electrons from the pinned layer (118) to the free layer (114). As electrons pass through the pinned layer (118), the spins of the electrons are polarized. When the spin-polarized electrons reach the free layer (114), the spin-polarized electrons apply a torque to the variable magnetic polarity and toggle the state of the variable magnetic polarity. Alternative approaches to reading or changing the variable magnetic polarity are also amenable. Further, magnetization polarities of the first ferromagnetic layer 114 and the second ferromagnetic layer 118 are perpendicular to an interface between the insulating barrier layer 116, and the first ferromagnetic layer 114 or the second ferromagnetic layer 118 making the MTJ 112 a perpendicular MTJ.

A top electrode 120 of the MRAM cell 102a is arranged over the second ferromagnetic layer 118. The top electrode 120 may be a conductive material, such as, for example, titanium nitride, tantalum nitride, titanium, tantalum, or a combination of one or more of the foregoing. Further, the top electrode 120 may be, for example, about 10-100 nanometers thick. The top electrode 120 has the same footprint as the MTJ 112. The top electrode 120 together with the MTJ 112, form a vertical stack 121 having substantially aligned vertical sidewalls. A footprint of the vertical stack 121 is smaller than a footprint of the bottom electrode 110.

Sidewall spacers 124a and 124b are also present and extend from an upper surface of the top electrode 120, along sidewalls of the top electrode 120 and the MTJ 112, to a point below or about even with an the upper surface of the ledge 111. In some embodiments, sidewall spacers 124a and 124b comprise SiN (silicon nitride). First capping layers 126a and 126b, extend along outer sidewalls of the sidewall spacers 124a and 124b, sidewalls of the bottom electrode 110, and along upper surfaces of dielectric protection layer 108a and 108b. In some embodiments the first capping layers 126a and 126b comprise SiC. Second capping layers 128a and 128b extend along exposed outer sidewalls (along the length) of the first capping layers 126a and 126b. In some embodiments, the second capping layers 128a and 128b comprise TEOS (tetraethyl orthosilicate). Interlayer dielectric (ILD) layers 130a and 130b are disposed over the second capping layers 128a and 128b respectively. In some embodiments, ILD layers 130a and 130b comprise an ELK dielectric layer (i.e., a dielectric with a dielectric constant κ less than 3.9), such as undoped silicate glass, fluorine doped silicon dioxide, carbon doped silicon dioxide, porous silicon dioxide, or spin-on polymetric dielectrics, such as polynorbornenes, benzocyclobutene, hydrogen silsesquioxane (HSQ) or methylsilsesquioxane (MSQ). A top metal 132 which is part of a second metallization layer (not shown) is disposed over an entire upper surface of the MRAM cell 102a. In some embodiments, the top metal 132 comprises copper, gold, aluminum, tungsten or combinations thereof.

Figure 1B:
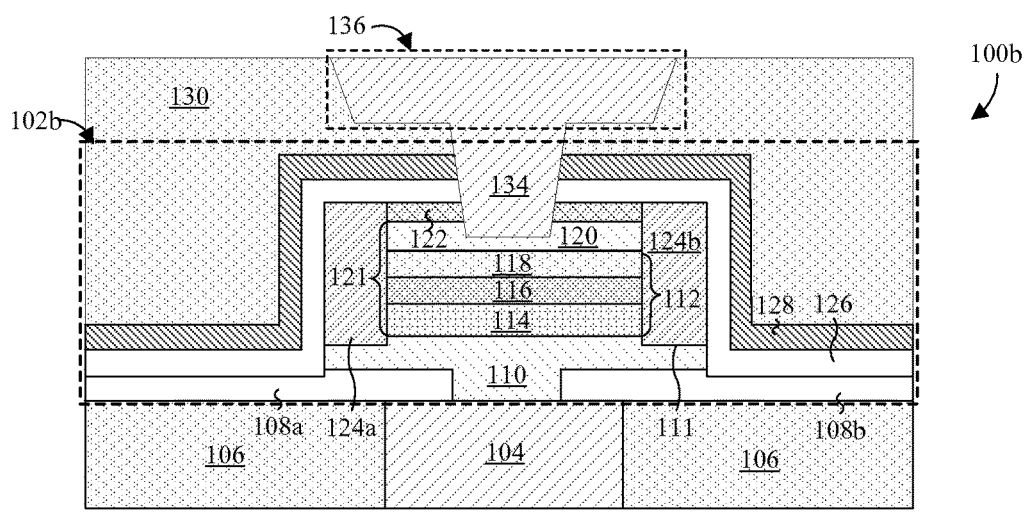
FIG. 1B illustrates a cross-sectional view of some embodiments of an MRAM cell, including a perpendicular MTJ, according to the present disclosure.

With reference to FIG. 1B, a cross-sectional view 100b of some embodiments of a MRAM cell 102b having a p-MTJ is provided. Here, unlike FIG. 1A, a hard mask 122 is disposed over the top electrode 120. Hard mask 122 defines the footprint of the top electrode 120 and the underlying MTJ 112. In some embodiments, the hard mask comprises USG (un-doped silicon glass). Here, sidewall spacers 124a and 124b extend from along an upper surface of the hard mask 122. A first capping layer 126 abuts outer sidewalls and upper surfaces of the sidewall spacers 124a and 124b, upper surface of the hard mask 122, outer sidewalls of the bottom electrode 110 and further extends over upper surfaces of the first and second dielectric protection layers 108a and 108b. A top electrode via (TEVA) 134 extends from the top electrode layer 120, through the hard mask 122, the first capping layer 126, the second capping layer 128 and the ILD layer 130, to a metal trench 136. Metal trench 136 is part of the second metallization layer (not shown). The TEVA 134 electrically couples the MRAM cell 102b to the second metallization layer. The TEVA 134 and the metal trench 136 may be, for example, a metal, such as copper, aluminum, tungsten or combinations thereof.

Advantageously, the footprint of the vertical stack 121 is sufficient for forming a TEVA over the MRAM cell 102b. As described in greater detail hereafter, the perpendicular anisotropy of ferromagnetic layers of the MTJ 112 advantageously allows a thinner MRAM cell (102a and 102b) which allows for a thinner ILD layer 130 compared to traditional approaches, to protect the MTJ 112 from future BEOL metallization processing steps. The thinner ILD layer 130 also does not require a CMP process. Thus, formation of MRAM cells 102a and 102b, given in FIGS. 1A and 1B respectively, provides better MRAM operations with reduced manufacturing cost.

Figure 2:
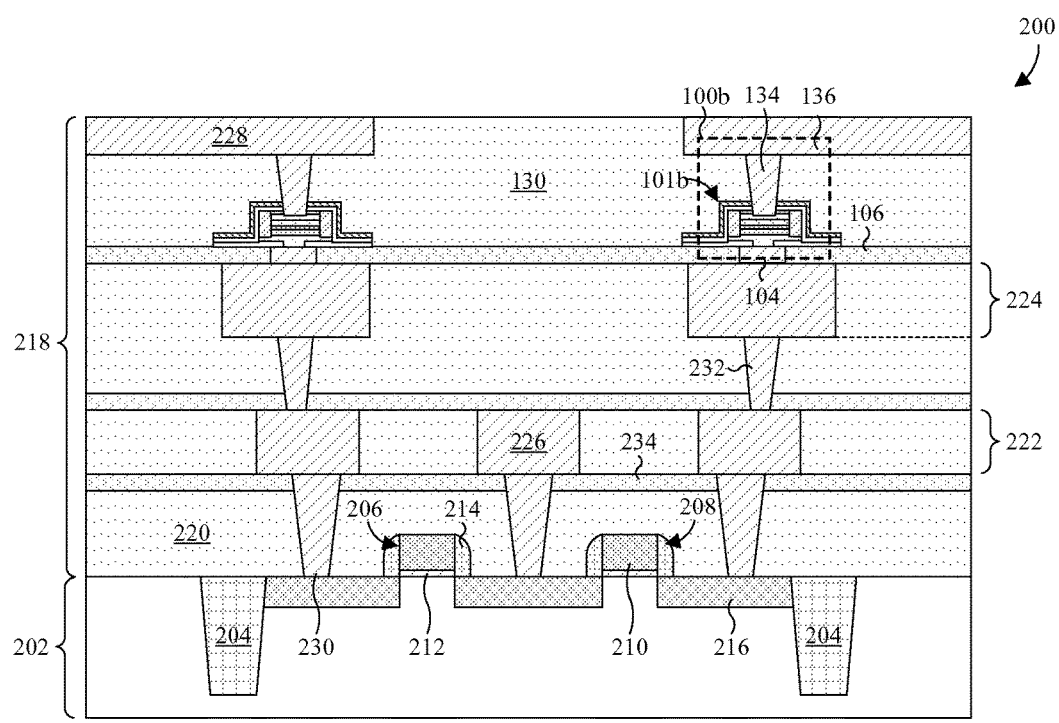
FIG. 2 illustrates a cross-sectional view of some embodiments of an integrated circuit including a MRAM cell with a perpendicular MTJ.

With reference to FIG. 2, a cross sectional view 200 of some embodiments of an integrated circuit is provided. The integrated circuit includes a substrate 202. The substrate 202 may be, for example, a bulk substrate (e.g., a bulk silicon substrate) or a silicon-on-insulator (SOI) substrate. One or more, shallow trench isolation (STI) regions 204 are disposed in the substrate 202, and two word line transistors 206, 208 are spaced between the STI regions 204. The STI regions 204 may be, or otherwise include, an oxide-filled trench within the substrate 202.

The word line transistors 206, 208 extend parallel to each other, and include word line gates 210, word line dielectric layers 212, word line sidewall spacer layers 214, and source/drain regions 216. The word line gates 210 are arranged over corresponding word line dielectric layers 212, and lined by corresponding word line sidewall spacer layers 214. The source/drain regions 216 are embedded within the surface of the substrate 202 between the word line gates 210 and the STI regions 204. The word line gates 210 may be, for example, doped polysilicon or a metal, such as titanium nitride or tantalum nitride. The word line dielectric layers 212 may be, for example, an oxide, such as silicon dioxide. The word line sidewall spacer layers 214 may be, for example, SiN. The source/drain regions 216 correspond to, for example, doped regions of the substrate 202.

A BEOL metallization stack 218 is arranged over the substrate 202. The BEOL metallization stack 218 includes a plurality of ILD layers 130, 220, a pair of MRAM cells 102b, and a plurality of metallization layers 222, 224. The MRAM cells 102b are as described with FIG. 1B and are arranged within the ILD layers 130, 220. The metallization layers 222, 224 include metal lines 226, 228 and are also arranged within the ILD layers 130, 220. The metal lines 226, 228 include a source line 226 arranged parallel to and between the word line transistors 208. Further, the metal lines 226, 228 include bit lines 228 corresponding to the MRAM cells 102b that extend parallel to each other and laterally perpendicular to the word line transistors 208. The ILD layers 130, 220 may be, for example, a low κ dielectric, such as undoped silicate glass, or an oxide, such as silicon dioxide. In some embodiments, bottom-most ILD layer 220 is an oxide and the other ILD layers 130 are a low κ dielectric. The metallization layers 222, 224 may be, for example, a metal, such as copper or aluminum.

Contacts 230 extend from the metallization layer 222 to the source/drain regions 216, and vias 104, 134, 232 extend between the metallization layers 222, 224 and the MRAM cells 102b. The contacts 230 and the vias 104, 134, 232 extend through dielectric layers 106, 234 (etch stop layers) arranged between the ILD layers 130, 220 and the metallization layers 222, 224. In some embodiments, the contacts 230 and the vias 104, 134, 232 have different shapes. For example, the contacts 230 and vias 134, 232 may have tapering widths, whereas the via 104 may have a uniform width. The dielectric layers 106, 234 (etch stop layers) may be, for example, an ELK dielectric. The contacts 230 and the vias 104, 134, 232 may be, for example, a metal, such as copper, gold, or tungsten.

Figure 3:
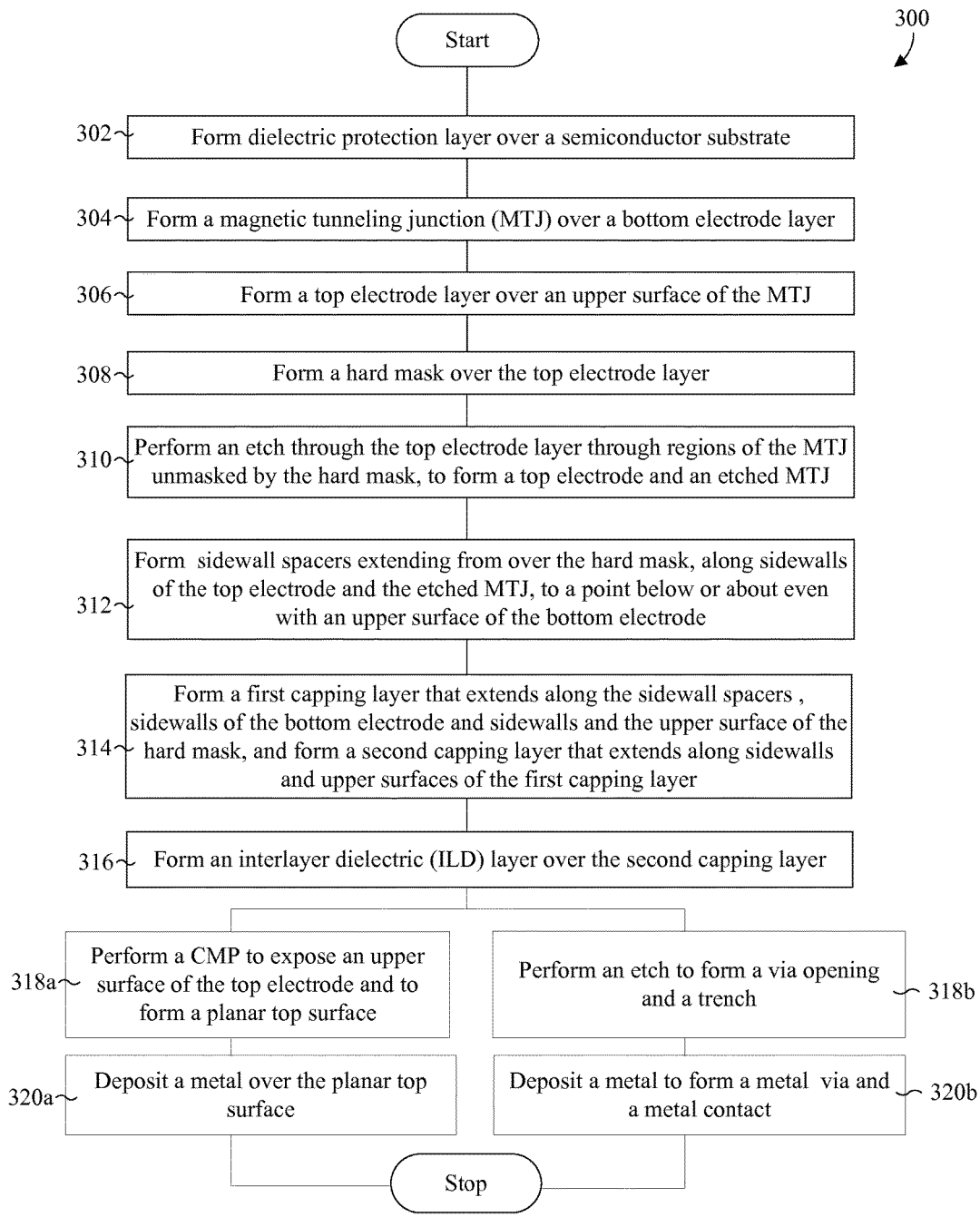
FIG. 3 illustrates a flow chart of some embodiments of a method for manufacturing an MRAM cell according to the present disclosure.

With reference to FIG. 3, a flowchart 300 illustrates a flowchart of some embodiments of a method for manufacturing a semiconductor structure having a MRAM cell with a p-MTJ according to some embodiments of the present disclosure. It will be appreciated that the illustrated method is not interpreted in a limiting sense, and that alternate methods for forming a MRAM cell with a p-MTJ may also be considered within the scope of the disclosure.

At 302, a dielectric protection layer is formed over a semiconductor substrate.

At 304, a MTJ is formed over the bottom electrode. The MTJ comprises an insulating barrier layer sandwiched between a first ferromagnetic layer and a second ferromagnetic layer, wherein magnetic polarities of the first and second ferromagnetic layers are perpendicular to an interface between the insulating barrier layer and the first ferromagnetic layer or the second ferromagnetic layer. In some embodiments, the first ferromagnetic layer is a free layer and the second ferromagnetic layer is a pinned layer.

At 306, a top electrode layer is formed over an upper surface of the MTJ.

At 308, a hard mask is formed over the top electrode layer.

At 310, a first etch is performed through the top electrode layer through regions of the MTJ unmasked by the hard mask, to form a top electrode and an etched MTJ.

At 312, sidewall spacers are formed that extend from over the hard mask, along sidewalls of the top electrode and the etched MTJ, to a point below or about even with an upper surface of the bottom electrode.

At 314, a first capping layer that extends along, upper surfaces and sidewalls of the sidewall spacers, sidewalls of the bottom electrode, and an upper surface of the hard mask, is formed, followed by formation a second capping layer that extends along sidewalls and upper surfaces of the first capping layer.

At 316, an ILD layer is formed over the second capping layer.

Blocks 318a and 320a show one example of how electrical contact can be made to the top electrode. At 318a, a CMP is performed over the ILD layer to expose an upper surface of the top electrode and to form a planar top surface. At 320a, a top metal is deposited over the planar top surface.

Blocks 318b and 320b show an alternate example of how electrical contact can be made to the top electrode. At 318b, a second etch is performed to form a via opening and a trench. At 320b, a metal is deposited in the via opening and the trench to form a TEVA (top electrode via) abutting the top electrode, and a metal trench respectively.

Advantageously, the method 300 includes reduced number of processing steps as it does not include an expanded or larger top electrode formation. The above described method also helps in having a reduced thickness for the ILD layer as well as the whole MRAM cell, which eliminates an additional CMP step. The method results in a simple and cost effective structure.

While the disclosed method (e.g., the method described by the flowchart 300) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 4 through 14A-14B, cross-sectional views of some embodiments of a semiconductor structure having an MRAM cell at various stages of manufacture are provided to illustrate the method of FIG. 3. Although FIGS. 4 through 14A-14B are described in relation to the method, it will be appreciated that the structures disclosed in FIGS. 4 through 14A-14B are not limited to the method, but instead may stand alone as structures independent of the method. Similarly, although the method is described in relation to FIGS. 4 through 14A-14B, it will be appreciated that the method is not limited to the structures disclosed in FIGS. 4 through 14A-14B, but instead may stand alone independent of the structures disclosed in FIGS. 4 through 14A-14B.

Figure 4:
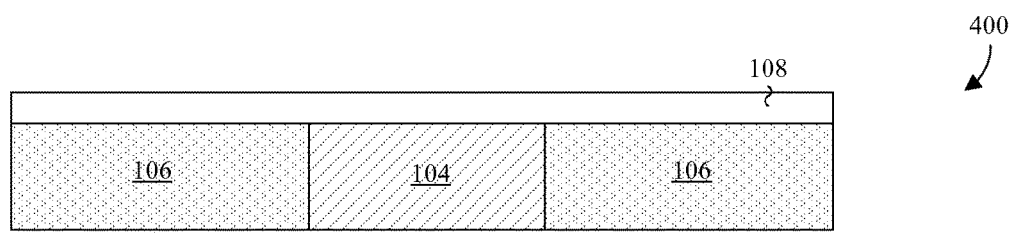

FIG. 4 illustrates a cross-sectional view 400 of some embodiments corresponding to Act 302.

As illustrated by FIG. 4, a dielectric protection layer 108 is formed over a bottom electrode via (BEVA) 104 disposed within a dielectric layer 106. In some embodiments, the dielectric layer 106 acts as an etch-stop layer, and is formed of, for example, an ELK or an oxide. In some embodiments, the dielectric protection layer 108 comprises SiC having a thickness of approximately 200 Angstroms. In some embodiments, the BEVA 104 comprises a metal, such as copper, gold or tungsten.

Figure 5:
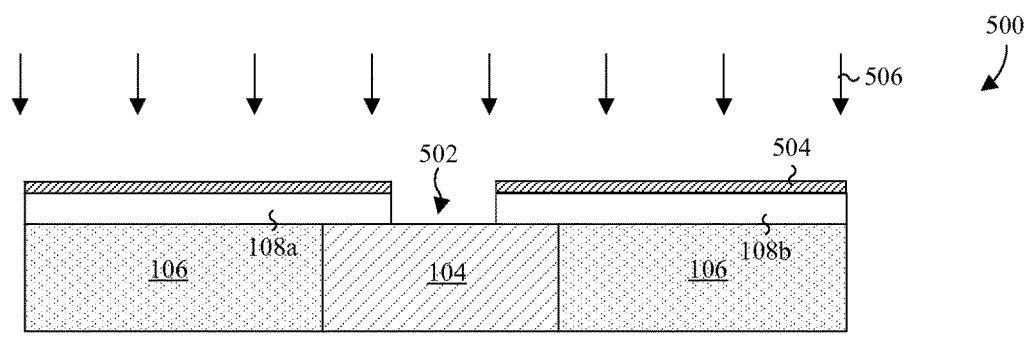

FIG. 5 illustrates a cross-sectional view 500 of some embodiments corresponding to Act 302.

As illustrated by FIG. 5, a first etch is performed over the dielectric protection layer 108 to form an opening 502. In some embodiments, the process for performing the first etch includes forming a first photoresist layer 504 masking regions of the dielectric protection layer 108 surrounding the opening 502. Thereafter, an etchant 506 (e.g., a wet etchant or a plasma etchant) is applied to the dielectric protection layer 108 according to the first photoresist layer 504 to form the opening 502. The first photoresist layer 504 is removed after the etching.

Figure 6:
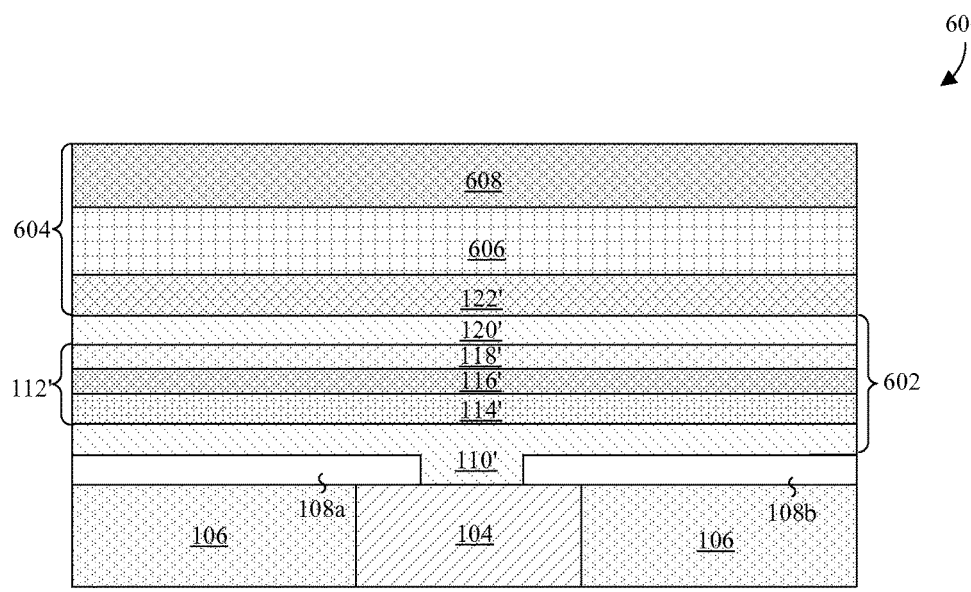

FIG. 6 illustrates a cross-sectional view 600 of some embodiments corresponding to Acts 304 and 306.

As illustrated by FIG. 6, a bottom electrode layer 110' is formed over the dielectric protection layer 108, a magnetic tunneling junction (MTJ) 112' is formed over an upper surface of the bottom electrode layer 110', and a top electrode layer 120' is formed over an upper surface of the MTJ 112'. The bottom electrode layer 110' may be a conductive material, such as, for example, titanium nitride, tantalum nitride, titanium, tantalum, or a combination of one or more of the foregoing, and abuts the BEVA 104. Further, the bottom electrode layer 110' may be, for example, about 10-100 nanometers thick. The MTJ 112' comprises a first ferromagnetic layer 114', an insulating barrier layer 116', and a second ferromagnetic layer 118'. In some embodiments, the first ferromagnetic layer 114' is configured to switch between at least two magnetic polarities and the second ferromagnetic layer 118' has a fixed magnetic polarity. In some embodiments, the first ferromagnetic layer 114' comprises FePt or CoFeB having a thickness ranging between approximately 8 angstroms and approximately 13 angstroms, and the second ferromagnetic layer 118' comprises single or multiple layers of Co, Ni or Ru. In some embodiments, the top electrode layer 120' may be a conductive material, such as, for example, titanium nitride, tantalum nitride, titanium, tantalum, or a combination of one or more of the foregoing. Further, the top electrode layer 120' may be, for example, about 10-100 nanometers thick. The bottom electrode layer 110', the MTJ 112', and the top electrode layer 120' together form an MRAM stack 602.

A patterning hard mask stack 604 is also disposed over an upper surface of the top electrode layer 120'. The patterning hard mask stack 604 comprises a hard mask layer 122', an advanced patterning film (APF) 606 and a dielectric film 608, stacked in that order. The three layers of the patterning hard mask layer 604 are chosen according to a refractive index suited for a lithography process. In some embodiments, the hard mask layer 122' comprises USG having a thickness of approximately 1350 Angstroms, the APF 606 has a thickness of approximately 1800 Angstroms, and the dielectric film 608 comprises SiON (silicon oxynitride) having a thickness of approximately 450 Angstroms. The bottom electrode layer 110', the MTJ 112', the top electrode layer 120' and the patterning hard mask stack 604 can be formed using any suitable deposition technique, such as chemical vapor deposition (CVD) or physical vapor deposition (PVD).

Figure 7:
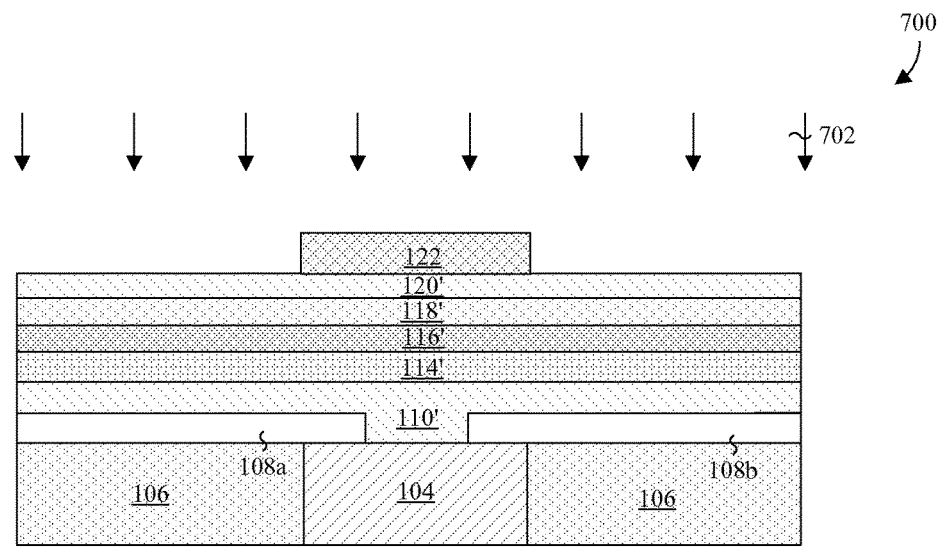

FIG. 7 illustrates a cross-sectional view 700 of some embodiments corresponding to Act 308.

As illustrated by FIG. 7, the hard mask stack 604 is patterned, and with the patterned hard mask stack in place, a second etch is performed. The second etch proceeds through regions of the hard mask layer 122'. In some embodiments, the second etch comprises, applying a wet etchant or a plasma etchant 702 for a predetermined period of time.

Figure 8:
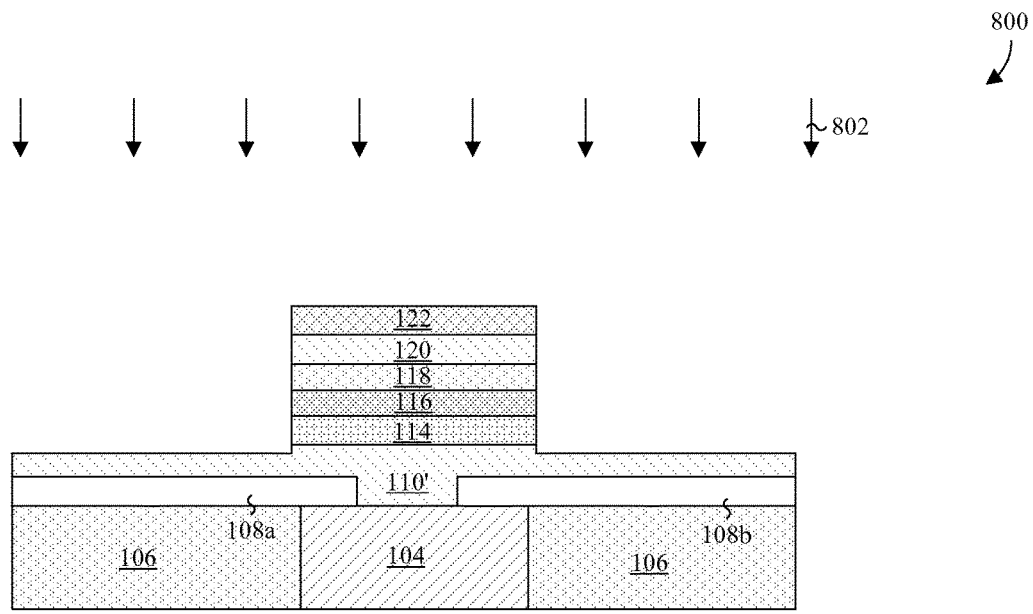

FIG. 8 illustrates a cross-sectional view 800 of some embodiments corresponding to Act 310.

As illustrated in FIG. 8, a third etch is performed to the bottom electrode layer 110' through regions of the top electrode layer 120' and the MTJ 112' unmasked by the hard mask 122, to form a top electrode 120 and an etched MTJ 112. In some embodiments, the process for performing the second etch includes applying an etchant 802 (e.g., a wet etchant or a plasma etchant) to the MRAM stack 602 for a period of time sufficient to etch to the bottom electrode layer 110'. The etchant 802 typically selectively etches the top electrode layer 120' and the MTJ 112', while leaving the hard mask 122 and the bottom electrode layer 110' substantially in place. In some embodiments, the etchant 802 may erode the remaining hard mask 122.

Figure 9:
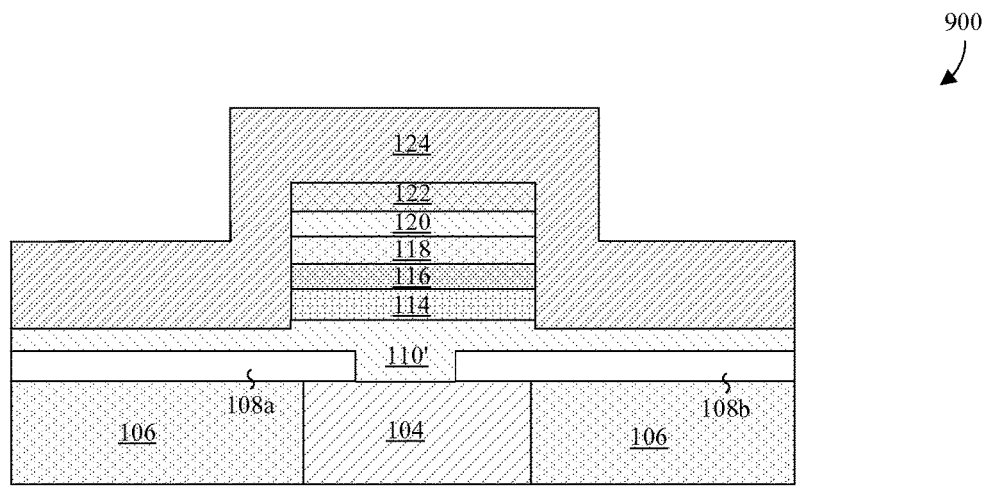
Figure 10:
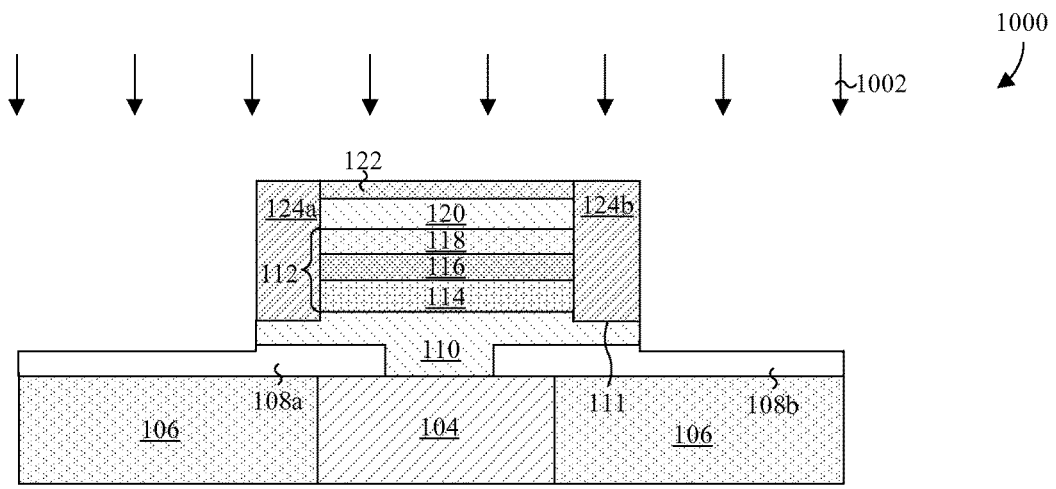

FIGS. 9 and 10 illustrate cross-sectional views 900 and 1000 of some embodiments corresponding to Act 312.

As illustrated in FIG. 9, a sidewall spacer layer 124 is formed over the hard mask 122 and the bottom electrode layer 110', lining the upper surface and sidewalls of the hard mask 122 and sidewalls of the etched MTJ 112. In some embodiments, the sidewall spacer layer 124 may be formed by any suitable deposition technique and is typically formed conformally. Further, the sidewall spacer layer 124 may be formed of, for example, silicon nitride, silicon carbide, or a combination of one or more of the foregoing. Even more, the sidewall spacer layer 124 may be formed with a thickness of, for example, about 500 Angstroms.

As illustrated in FIG. 10, a fourth etch is performed into the sidewall spacer layer 124 to etch sidewall spacer layer 124 back to below or about even with a top surface of the hard mask 122 and to remove lateral stretches of the sidewall spacer layer 124. The fourth etch also etches lateral stretches of the bottom electrode layer 110' to form a bottom electrode 110. In some embodiments, the process for performing the fourth etch includes exposing the sidewall spacer layer 124 to an etchant 1002 for a predetermined period of time sufficient to etch through the thickness of the sidewall spacer layer 124 and the bottom electrode layer 110'. The etchant 1002 is typically preferential of the sidewall spacer layer 124 and the bottom electrode layer 110', relative to the hard mask 122 and the dielectric protection layers 108a and 108b. In some embodiments, the etchant 1002 may erode the hard mask 122. In some embodiments, the upper outer corners of spacers 124a, 124b may be rounded, rather than squared-off as shown in FIG. 10.

Advantageously, the perpendicular MTJ 112 has sufficient space for landing a TEVA over the top electrode 120. Thus, no additional processing steps are needed for forming a larger top electrode. The hard mask 122 remains over the top electrode 120 for providing isolation along the vertical plane.

Figure 11:
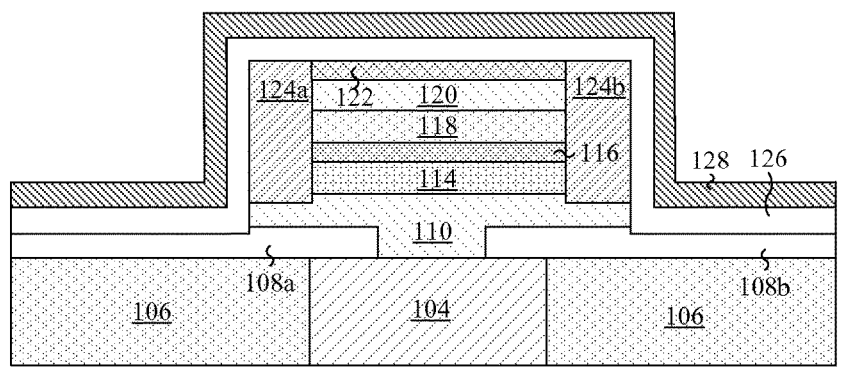

FIG. 11 illustrates cross-sectional view 1100 of some embodiments corresponding to Act 314.

As illustrated in FIG. 11, a first capping layer 126 is formed over the dielectric protection layers 108a and 108b, and further lines outer sidewalls of the bottom electrode 110, upper surface of the hard mask 122, and outer sidewalls and upper surfaces of the sidewall spacers 124a and 124b. In some embodiments, the first capping layer 126 comprises SiC. A second capping layer 128 is formed over the first capping layer 126, lining outer sidewalls and upper surfaces of the first capping layer 126. In some embodiments, the second capping layer 128 comprises TEOS. In some embodiments, the first capping layer 126 and the second capping layer 128 may be formed by any suitable deposition technique and are typically formed conformally.

Figure 12:
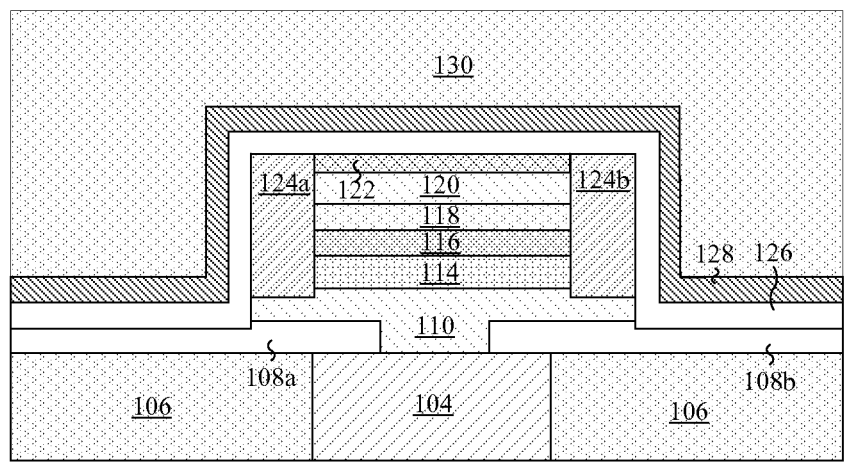

FIG. 12 illustrates cross-sectional view 1200 of some embodiments corresponding to Act 316.

As illustrated in FIG. 12, an ILD layer 130 is formed over the second capping layer 128. In some embodiments, ILD layer 130 may be formed by any suitable deposition technique and is typically formed conformally. Further, the ILD layer 130 may be formed of, for example an ELK dielectric layer, to a thickness of approximately 2650 Angstroms. A curing process is typically followed after depositing the ELK dielectric layer to increase their porosities, lower their k values, and improve their mechanical strengths.

Advantageously, since the top electrode 120 is thinner than in-plane MTJ structures, a thinner ILD layer 130 is formed over the second capping layer 128. This eliminates the need for a CMP process, for planarizing a thick ILD layer.

Figure 13A:
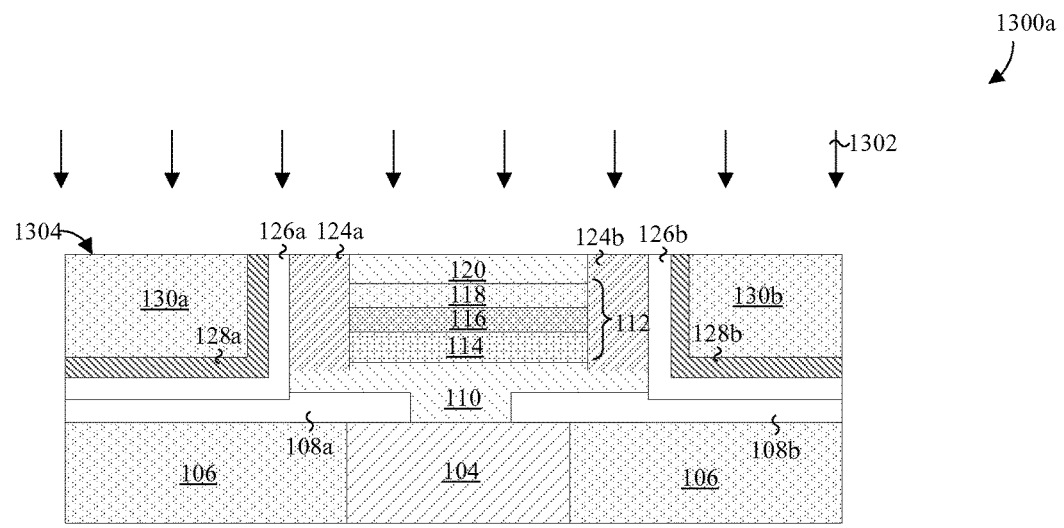
Figure 14A:
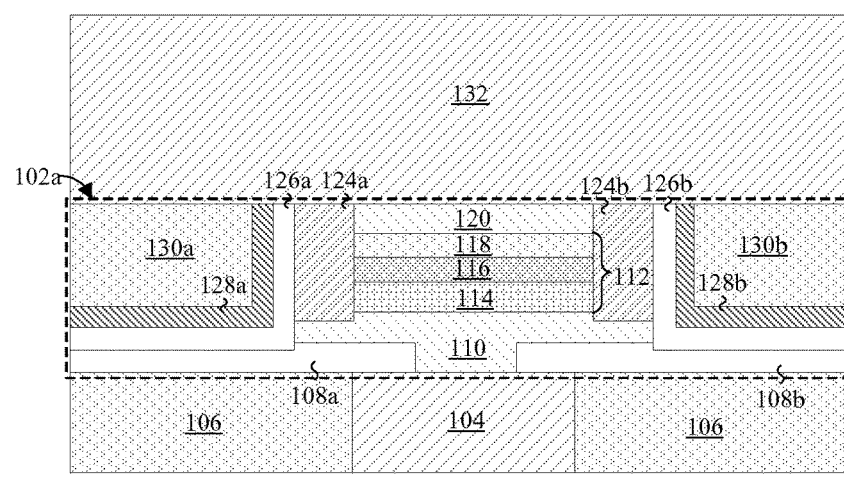
Figure 13B:
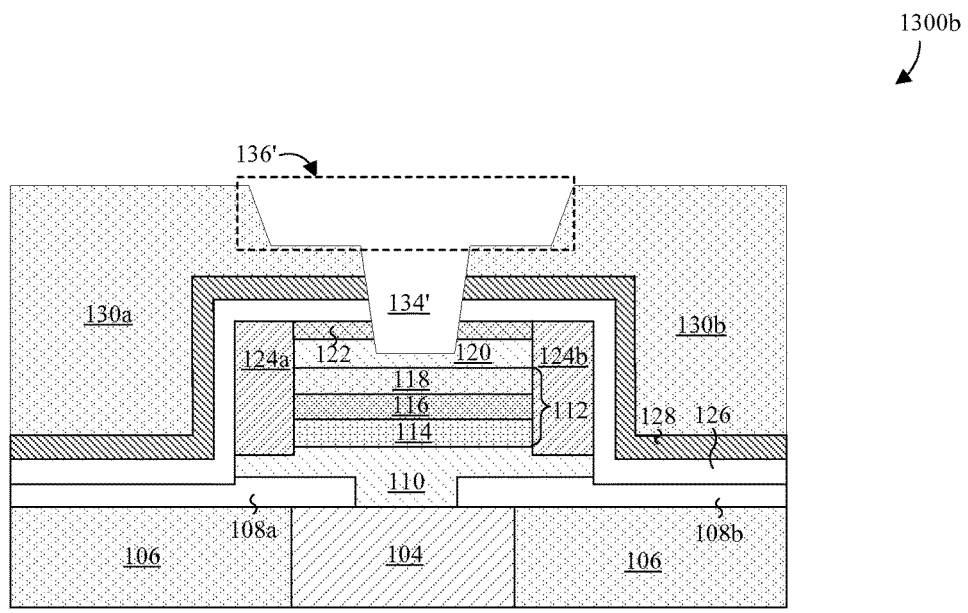
Figure 14B:
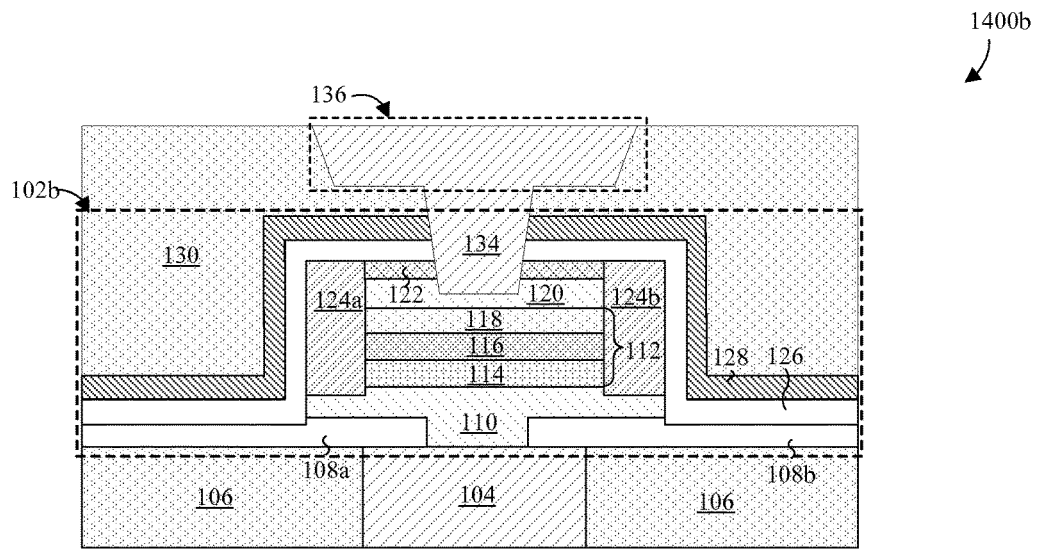

FIGS. 13A and 14A illustrate cross sectional views during formation of one embodiment, and FIGS. 13B and 14B illustrate cross sectional views during formation of a different embodiment of the present disclosure.

FIG. 13A illustrates cross-sectional view 1300a of some embodiments corresponding to Act 318a.

As illustrated in FIG. 13A, a CMP process 1302 is performed over the ILD layer 130 until the upper surface of the top electrode 120 is exposed, which results in formation of a planar top surface 1304. The CMP process 1302 polishes away upper portions of the ILD layer 130, the first capping layer 126 and the second capping layer 128, which divides them into ILD layers 130a and 130b, first capping layers 126a and 126b, and second capping layers 128a and 128b, respectively.

FIG. 14A illustrates cross-sectional view 1400a of some embodiments corresponding to Act 320a.

As illustrated in FIG. 14A, a top metal 132 is formed over the planar top surface 1304. The top metal is part of a second metallization layer (not shown) and it abuts an entire surface area of the top electrode 120 providing electrical connection to the MRAM cell 102a. In some embodiments, the top metal comprises tungsten or copper.

FIG. 13B illustrates cross-sectional view 1300b of some embodiments corresponding to Act 318b.

As illustrated in FIG. 13B, a via opening 134' and a trench 136' are formed by one or more photolithography processes. The via opening 134' may be formed by a fifth etch that extends through the ILD layer 130, the second capping layer 128, the first capping layer 126, and the hard mask 122, and stops in the top electrode 120. The process of forming the trench 136' may include a sixth etch performed on the ILD layer 130, with a patterned photoresist (not shown) in place above the ILD layer 130. The fifth and sixth etches may comprise dry etching (e.g., a plasma etchant, an RIE etchant, etc.) or wet etching (e.g., hydrofluoric acid as etchant).

FIG. 14B illustrates cross-sectional view 1400b of some embodiments, corresponding to Act 320b.

As illustrated in FIG. 14B, a metal layer is deposited over the via opening 134' and the trench 136', followed by a CMP process in some embodiments, to form a TEVA 134 and a metal trench 136. In some embodiments, the TEVA 134 and the metal trench 136 comprise tungsten or copper. The metal trench 136 is part of a second metallization layer (not shown) and the TEVA 134 electrically connects the MRAM cell 102b to the second metallization layer. In some embodiments, the TEVA 134 can be formed by a damascene or dual-damascene process.

Thus, as can be appreciated from above, the present disclosure provides a method for manufacturing a magnetoresistive random-access memory (MRAM) cell, the method including, forming a magnetic tunneling junction (MTJ) over a bottom electrode layer. A top electrode layer is formed over an upper surface of the MTJ, and a hard mask is formed over an upper surface of the top electrode layer. A first etch is performed through the top electrode layer, through regions of the MTJ unmasked by the hard mask, to form a top electrode and an etched MTJ. Sidewall spacers are formed, extending from an upper surface of the hard mask or the top electrode, along sidewalls of the top electrode and the etched MTJ, to a point below or about even with an upper surface of the bottom electrode layer.

In other embodiments, the present disclosure provides a magnetoresistive random-access memory (MRAM) cell including, a magnetic tunneling junction (MTJ) disposed over a bottom electrode. A top electrode is disposed over an upper surface of the MTJ. Sidewall spacers are disposed over an upper surface of the bottom electrode, abutting outer sidewalls of the MTJ and outer sidewalls of the top electrode. Sidewall spacers extend upwardly along from an upper surface of the bottom electrode to an upper surface of the top electrode with a substantially uniform width. A first capping layer is disposed, abutting outer sidewalls of the sidewall spacers and the bottom electrode.

In yet other embodiments, the present disclosure provides a magnetoresistive random-access memory (MRAM) cell including, a bottom electrode disposed over a dielectric protection layer having an opening. A free layer configured to switch between at least two different magnetic polarities is disposed over the bottom electrode. An insulating barrier layer is disposed over the free layer, and a pinned layer having a fixed magnetic polarity is disposed over the insulating barrier layer. Magnetic polarities of the free and the pinned layer are perpendicular to an interface between the insulating barrier layer and the pinned layer or the free layer. A top electrode is disposed over the pinned layer and a hard mask is disposed over an upper surface of the top electrode. Sidewall spacers are arranged, extending from an upper surface of the bottom electrode to the upper surface of the top electrode or an upper surface of the hard mask with a substantially uniform width. A first capping layer is disposed, extending over the sidewall spacers, and along sidewalls of the bottom electrode and the hard mask. A back end of line (BEOL) metallization stack includes a first metallization layer and a second metallization layer stacked on opposing sides of the MRAM cell. A first via extending from the bottom electrode to the first metallization layer is disposed within a first dielectric layer. The bottom electrode extends through the opening to abut the first via, and a second via extending from the top electrode to the second metallization layer, is disposed within a second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a magnetoresistive random-access memory (MRAM) cell, the method including:
   forming a bottom electrode layer over a protective layer, the bottom electrode layer having a central portion that extends through the protective layer, and a peripheral portion having a lower surface in direct contact with an upper surface of the protection layer;
   forming a magnetic tunneling junction (MTJ) over the bottom electrode layer;
   forming a top electrode layer over an upper surface of the MTJ;
   forming a dielectric hard mask over an upper surface of the top electrode layer;
   performing a first etch which thins the dielectric hard mask and extends through the top electrode layer and through regions of the MTJ unmasked by the dielectric hard mask, and through an upper surface but not a lower surface of the bottom electrode layer to define a ledge, to form a top electrode and an etched MTJ with a thinned portion of the dielectric hard mask remaining in place over the top electrode; and
   forming sidewall spacers extending from an upper surface of the thinned portion of the dielectric hard mask, along sidewalls of the top electrode and the etched MTJ, to an upper surface of the ledge of the bottom electrode layer;
   wherein the MTJ includes:
      a first ferromagnetic layer;
      an insulating barrier layer disposed over the first ferromagnetic layer; and
      a second ferromagnetic layer disposed over the insulating barrier layer, wherein magnetic polarities of the first ferromagnetic layer and the second ferromagnetic layer are perpendicular to an interface between the insulating barrier layer and the first ferromagnetic layer or the second ferromagnetic layer.

2. The method according to claim 1, wherein the first ferromagnetic layer is configured to switch between at least two magnetic polarities and the second ferromagnetic layer has a fixed magnetic polarity.

3. The method according to claim 1, wherein forming the sidewall spacers includes:
   forming a sidewall spacer layer over the thinned portion of the dielectric hard mask, and lining the upper surface and sidewalls of the thinned portion of the dielectric hard mask and sidewalls of the etched MTJ; and
   performing a second etch into the sidewall spacer layer to form the sidewall spacers.

4. The method according to claim 3, wherein the second etch further etches lateral stretches of the bottom electrode layer, to form a bottom electrode.

5. The method according to claim 4, further including:
   forming a first capping layer that extends along the sidewall spacers, sidewalls of the bottom electrode and the sidewalls and the upper surface of the thinned portion of the dielectric hard mask;
   forming a second capping layer that extends along sidewalls and upper surfaces of the first capping layer; and
   depositing an interlayer dielectric (ILD) layer over upper surfaces and sidewalls of the second capping layer.

6. The method according to claim 5, further including:
   photo patterning and etching the ILD layer to form a via opening and a trench; and
   filling the via opening and the trench respectively with a metal layer to form a TEVA (top electrode via) and a metal trench.

7. The method according to claim 6, wherein the TEVA extends through the first capping layer, the second capping layer- and the thinned portion of the dielectric hard mask to abut the top electrode.

8. The method according to claim 4, further including:
   performing a CMP (chemical mechanical polishing) process to planarize an upper surface of the top electrode and to form a planar top surface; and
   depositing a top metal over the planar top surface and abutting the top electrode.

9. A method for manufacturing a magnetoresistive random-access memory (MRAM) cell, the method including:
   forming a bottom electrode layer over a dielectric protective layer, the bottom electrode layer having a central portion that extends through the dielectric protective layer, and having a peripheral portion having a lower surface in direct contact with an upper surface of the dielectric protective layer;

forming a magnetic tunneling junction (MTJ) over the bottom electrode layer;

forming a top electrode layer over an upper surface of the MTJ;

forming an un-doped silicate glass (USG) hard mask over an upper surface of the top electrode layer;

performing a first etch which erodes the USG hard mask and which extends through the top electrode layer and through regions of the MTJ unmasked by the USG hard mask, and through an upper surface but not a lower surface of the bottom electrode layer to define a ledge, to form a top electrode and an etched MTJ with an eroded portion of the USG hard mask remaining in place over an upper surface of the top electrode;

forming sidewall spacers extending from an upper surface of the eroded portion of the USG hard mask, along sidewalls of the top electrode and the MTJ, to the ledge of the bottom electrode layer; and wherein the sidewalls spacers have substantially uniform width from an upper surface of the eroded portion of the USG hard mask, to the ledge of the bottom electrode layer;

wherein forming the MTJ includes:
  forming a first ferromagnetic layer over the bottom electrode;
  forming an insulating barrier layer over the first ferromagnetic layer; and
  forming a second ferromagnetic layer over the insulating barrier layer, wherein magnetic polarities of the first ferromagnetic layer and the second ferromagnetic layer are perpendicular to an interface between the insulating barrier layer and the first ferromagnetic layer or the second ferromagnetic layer.

10. The method according to claim 9, wherein the first ferromagnetic layer is configured to switch between at least two magnetic polarities and the second ferromagnetic layer has a fixed magnetic polarity.

11. The method according to claim 9, wherein forming the sidewall spacers includes:
  forming a sidewall spacer layer over the USG hard mask, and lining the upper surface and sidewalls of the USG hard mask and sidewalls of the top electrode and the MTJ; and
  performing a second etch into the sidewall spacer layer to form the sidewall spacers.

12. The method according to claim 11, wherein the second etch removes lateral stretches of the bottom electrode layer to form a bottom electrode.

13. The method according to claim 12, further including:
  forming a first capping layer that extends along the sidewalls and upper surfaces of the sidewall spacers, along sidewalls of the bottom electrode, and along the sidewalls and the upper surface of the hard mask;
  forming a second capping layer that extends along sidewalls and upper surfaces of the first capping layer; and
  depositing an interlayer dielectric (ILD) layer over sidewalls and upper surfaces of the second capping layer.

14. The method according to claim 13, further including:
  photo patterning and etching the ILD layer to form a via opening and a trench; and
  filling the via opening and the trench respectively with a metal layer to form a top electrode via and a metal trench.

15. The method according to claim 14, wherein the top electrode via extends through the first capping layer, the second capping layer and the hard mask to abut the top electrode.

16. The method according to claim 12, further including:
  performing a CMP (chemical mechanical polishing) process to planarize an upper surface of the top electrode and to form a planar top surface; and
  depositing a top metal over the planar top surface and abutting the top electrode.

17. A method for manufacturing a magnetoresistive random-access memory (MRAM) cell, the method including:
  forming a bottom electrode layer over a dielectric protective layer, the bottom electrode layer having a central portion that extends through the dielectric protective layer and a peripheral portion having a lower surface in direct contact with an upper surface of the dielectric protection layer;
  forming a magnetic tunneling junction (MTJ) over the bottom electrode layer;
  wherein forming the MTJ includes:
    forming a first ferromagnetic layer over the bottom electrode layer;
    forming an insulating barrier layer over the first ferromagnetic layer; and
    forming a second ferromagnetic layer over the insulating barrier layer, wherein magnetic polarities of the first ferromagnetic layer and the second ferromagnetic layer are perpendicular to an interface between the insulating barrier layer and the first ferromagnetic layer or the second ferromagnetic layer;
  forming a top electrode layer over an upper surface of the MTJ;
  forming a dielectric hard mask over an upper surface of the top electrode layer;
  performing a first etch through the top electrode layer and through regions of the MTJ unmasked by the dielectric hard mask, and through an upper surface of the bottom electrode layer to a depth within the bottom electrode layer to define a ledge, to form a top electrode and an etched MTJ; and
  forming sidewall spacers in direct contact with sidewalls of the dielectric hard mask, the top electrode and the etched MTJ; the sidewall spacers extending from an upper surface of the dielectric hard mask, along sidewalls of the top electrode and the etched MTJ, to the ledge of the bottom electrode layer.

18. The method according to claim 17, wherein the sidewall spacers comprise silicon nitride, silicon carbide, or a combination of silicon nitride and silicon carbide.

* * * * *